United States Patent [19]

Takeno et al.

[11] Patent Number: 4,772,520

[45] Date of Patent: Sep. 20, 1988

[54] THERMAL HEAD AND METHOD OF MANUFACTURING THE SAME

[75] Inventors: Shouzo Takeno, Yokohama; Hideki Matsui, Kawasaki; Kazushige Sasaki, Yokohama, all of Japan

[73] Assignee: Kabushiki Kaisha Toshiba, Kawasaki, Japan

[21] Appl. No.: 22,609

[22] Filed: Mar. 4, 1987

Related U.S. Application Data

[63] Continuation of Ser. No. 813,464, Dec. 24, 1985, abandoned.

[30] Foreign Application Priority Data

Dec. 28, 1984 [JP] Japan .................. 59-274722

[51] Int. Cl.$^4$ ............................................. H05B 1/00
[52] U.S. Cl. .................... 428/698; 428/701; 501/63; 427/34; 219/216; 219/543
[58] Field of Search ............... 427/34; 428/694, 701, 428/698, 699; 219/543, 216; 501/63

[56] References Cited

U.S. PATENT DOCUMENTS

| | | |
|---|---|---|
| 3,031,318 | 4/1962 | Rao .......................... 501/63 X |
| 3,537,868 | 11/1970 | Kosaka et al. ............... 501/63 X |
| 3,630,765 | 12/1971 | Arajo ........................ 501/63 X |
| 3,717,441 | 2/1973 | Rapp ........................... 501/63 |
| 4,105,892 | 8/1978 | Tashiro et al. . |
| 4,168,343 | 9/1979 | Arai et al. .................. 219/543 |
| 4,232,213 | 11/1980 | Taguchi et al. ............. 219/543 X |
| 4,536,645 | 8/1985 | Mio et al. ................... 219/543 |
| 4,595,823 | 6/1986 | Sorimachi et al. .......... 219/543 X |
| 4,608,293 | 8/1986 | Wada et al. ................. 428/701 X |
| 4,614,689 | 9/1986 | Iheda et al. ................. 428/698 X |
| 4,650,726 | 3/1987 | Yamaguchi et al. ......... 428/694 |

FOREIGN PATENT DOCUMENTS 0119811 5/1984 European Pat. Off. .
5761581 6/1982 Japan .

*Primary Examiner*—Nancy A. B. Swisher
*Attorney, Agent, or Firm*—Cushman, Darby & Cushman

[57] ABSTRACT

This invention discloses a thermal head having a resistive layer of a thin Ta-Si-O film containing more than 45 mol % and at most 75 mol % of a silicon oxide in terms of $SiO_2$, and a method of manufacturing a thermal head by sputtering a sintered target in vacuum atmosphere at an argon gas partial pressure of $10 \times 10^{-3}$ Torr to $80 \times 10^{-3}$ Torr so as to obtain the resistive layer.

6 Claims, 3 Drawing Sheets

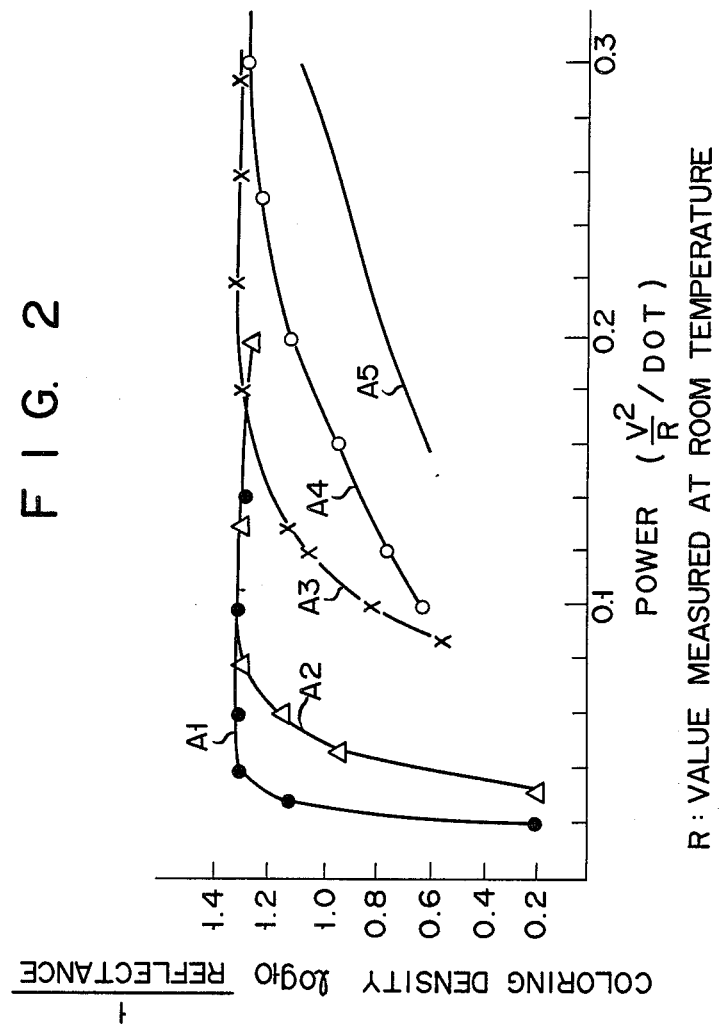

THERMAL HEAD AND METHOD OF MANUFACTURING THE SAME

This is a continuation of application Ser. No. 813,464, filed Dec. 24, 1985, which was abandoned upon the filing hereof.

BACKGROUND OF THE INVENTION

1. Field of the Invention

The present invention relates to a thermal head with a thin Ta-Si-O film as a resistive layer.

2. Description of the Prior Art

A thermal head with a resistive layer in the form of a thin film is used in an electrical thermal conversion output unit used in printing heat-sensitive paper. A conventional thermal head is manufactured as follows. A high-resistance substrate of, for example, alumina, is prepared one surface of which is covered with a thin glass layer. A resistive layer and lead layers for energizing the resistive layer are formed on the thin glass layer, in accordance with a known thin film fabrication technique. A protective film is formed on the resistive layer and lead layers as needed. Then, reverse-flow preventive elements such as transistors or diodes are arranged to provide connection between common leads and individual leads. A heat sink can be formed to provide a heat dissipation effect. Typical materials of which the resistive layer in a thermal head can be made are Ta-N, NiCr, or Ta-SiO$_2$.

In a thermal head having a resistive layer made of one of the above materials, a pulse current is supplied from an external power source to the resistive layer and heat generated by the resistive layer is conducted to heat-sensitive paper so as to change white into black and thereby perform printing. FIG. 4 is a sectional view of a conventional thermal head, illustrating the direction in which heat generated by the resistive layer is conducted. When current flows through resistive layer 3 upon application of a pulse voltage thereto, resistor 3 is heated by joules heat corresponding to the current in the resistor. Heat generated by resistor 3 is divided into heat flow $q_P$, conducted to heat-sensitive paper (not shown) through an antiwear protective layer 6, heat flow $q_B$, conducted to glazing layer 2 and alumina substrate 1, and heat flow $q_S$, conducted to lead layers 5. In general, thermal efficiency of heating dots in the thermal head is good as flow $q_P$ is increased and flows $q_S$ and $q_B$ are decreased. In a conventional thermal head, flow $q_P$ can be as undesirably low as about 20%. This level of thermal efficiency cannot provide good printing.

U.S. Pat. No. 4,105,892, issued to Tashiro et al., describes a thin amorphous film of Ta-Si-O, containing 7 to 53 mol% SiO$_2$. Tashiro et al. describe reproducibility and uniformity of the resistor but do not describe any improvements in the thermal efficiency of the heating dots.

Japanese Patent Disclosure No. 57-61581, describes a target used in forming a thin resistive layer film. The target is a sintered body obtained by sintering tantalum and a silicon dioxide. The content of tantalum is 63 to 55 mol%. Takeno et al. describe reproducibility and uniformity of the resistor but do not describe the heating efficiency of heating dots.

SUMMARY OF THE INVENTION

It is a principal object of the present invention to provide, in the interest of good printing, a highly thermally efficient thermal head.

It is another object of the present invention to provide a thermal head whose resistive layer is operated as a high heat resistor with a low current.

It is still another object of the present invention to provide a simple, compact system, including a thermal head and equipment such as a pulse motor and a light source associated with the thermal head, wherein the thermal head and associated equipment use a common power source.

It is still another object of the invention to provide a thermal head whose resistive layer has a resistance much higher than that of a lead layer resistance. Since most of the electrical power supplied to the head is used by the resistive layer, the voltage drop caused by the lead layer is much smaller than that caused by the resistive layer. Hence, as long as the unit comprised of the resistive layer and the lead layer is driven by a constant voltage, the variation of the voltage applied to the resistive layer is negligibly low, and a high-quality recording can be achieved.

In order to achieve the above objects of the present invention, the resistive layer has a Ta-Si-O composition and a content of silicon oxide in terms of SiO$_2$ which, as a sintering target, is more than 45 mol%, and 75 mol% at most. A target having such a composition is sputtered in vacuum atmosphere at an argon partial pressure of $10 \times 10^{-3}$ Torr to $80 \times 10^{-3}$ Torr.

The resistive layer in the thermal head is made of a thin film of the above composition, such that heat conduction from the resistive layer to heat-sensitive paper can be effectively performed to achieve the objects described above.

BRIEF DESCRIPTION OF THE DRAWINGS

FIG. 2 is a graph showing test results which explain the relationship between power required and optical density in various resistive layers listed in Table 2;

DESCRIPTION OF THE PREFERRED EMBODIMENT

A thermal head according to an embodiment of the present invention will be described with reference to the accompanying drawings.

Figure 1:
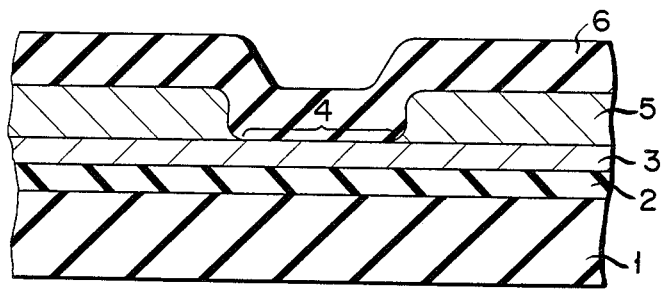
FIG. 1 is a schematic sectional view showing the main part of a thermal head according to an embodiment of the present invention.

FIG. 1 is a sectional view of a thermal head according to an embodiment of the present invention. In the thermmal head, glazing layer 2, of a thickness of 60 μm, is formed on alumina substrate 1, and resistive layer 3, of a thickness of 300 nm, is formed on layer 2. Resistive layer 3 is made of a thin film of a mixture of tantalum (to be referred to as Ta hereinafter), silicon (Si), oxygen (O), and intermediate products thereof. The content of silicon oxide in terms of SiO$_2$ (to be referred to as SiO$_2$) is more than 45 mol%, and 75 mol% at most, the amount of silicon and silicon compounds such as Ta-Si, silicon monooxide, silicon dioxide and so on being calculated on the basis of SiO$_2$. A layer of adhesion metal such as chromium or titanium is formed on resistive layer 3, except in the area of heater 4. Lead layers 5, e.g., gold layers having a thickness of 2 to 3 μm, are formed on the adhesion metal layer. Ta$_2$O$_5$ protective layer 6, several microns in thickness, is formed on the upper surfaces of heater 4 and lead layers 5.

Resistive layer 3 is formed in the following manner. Ta and SiO$_2$ are mixed and sintered to prepare a sintered target. The content of SiO$_2$ in the target is more than 45 mol%, and 75 mol% at most. The sintered target is RF(radio frequency)-sputtered in vacuum atmosphere to form resistive layer 3 on glazing layer 2 of substrate 1. Partial pressure of argon gas in vacuum atmosphere is $10 \times 10^{-3}$ Torr to $80 \times 10^{-3}$ Torr, and preferably $25 \times 10^{-3}$ Torr to $50 \times 10^{-3}$ Torr. When the argon gas partial pressure is set within the above range the composition ratio of the sintered target is similar to that of the resistive layer. Furthermore, even if the amounts of the respective components of the sintered target are made different from those of the resistive layer, their composition ratios will remain constant. In this way, the composition ratio of the resistive layer can easily be controlled. In particular, when the argon gas partial pressure is $30 \times 10^{-3}$ Torr, the composition ratio of the sintered target is the same as that of the resistive layer. Table 1 shows RF sputtering conditions.

TABLE 1

| Item | Condition |
| --- | --- |
| Vacuum Pressure | $2 \times 10^{-6}$ Torr |
| Argon Gas Partial Pressure | $30 \times 10^{-6}$ Torr |
| RF Power | |
| Travelling Wave | 1 kW |
| Reflecting Power | 20 W or less |
| Electrode Interval (In-Line Type) | 100 mm |

By using sintered targets of different compositions, resistive layers are formed under the RF sputtering conditions of Table 1 to prepare different thermal heads. The characteristics of these thermal heads are summarized in Table 2. Dimensions, pulse conditions, coloring sensitivity of the heat-sensitive paper, and feed speed of the paper are given in Table 3.

TABLE 2

| No. | Resistance (kΩ) | Sheet Resistance (k/Ω) | Resistivity (Ω-cm) | Analysis Result (SiO mol %) of Ta/SiO Composition of Heating Resistor |
| --- | --- | --- | --- | --- |
| Example 1 | 9 | 6.6 | $198 \times 10^{-3}$ | 62 |
| Example 2 | 5 | 3.7 | $111 \times 10^{-3}$ | 60 |
| Example 3 | 1.1 | 0.80 | $24 \times 10^{-3}$ | 50 |
| Comparative Example 4 | 0.3 | 0.22 | $6.6 \times 10^{-3}$ | 45 |
| Comparative Example 5 | 0.13 | 0.10 | $3.0 \times 10^{-3}$ | 40 |

TABLE 3

| Item | Condition |
| --- | --- |
| Resistor Film Thickness | 300 nm |
| Resistor Size | 75μ wide, 55μ long (longitudinal direction) |
| Application Pulse | 0.5 ms ON/2 ms period |
| Heat-Sensitive Paper | TP50K$_5$-4HX (Trade Name: available from Jujoseishi K.K.) |
| Paper Feed Speed | 27.5 mm/sec |

As is apparent from Table 2, the resistance of the resistive layers depends on their respective resistivities. The resistance of resistive layers is increased when the SiO$_2$ content is increased. When the content of SiO$_2$ is 45 mol% or more, thermal heads are free from the influence of lead layer resistance. Thus, when recording is performed on heat-sensitive paper using thermal heads containing the resistive layers of the present invention, density variations in the recorded information can be prevented.

Thermal heads having the different compositions shown in Table 2 have actually been driven to check optical densities, and the results are summarized in FIG. 2. Curves A1 to A5 in FIG. 5 correspond to examples 1 to 3 and comparative examples 4 and 5 of Table 2, respectively.

Figure 3:
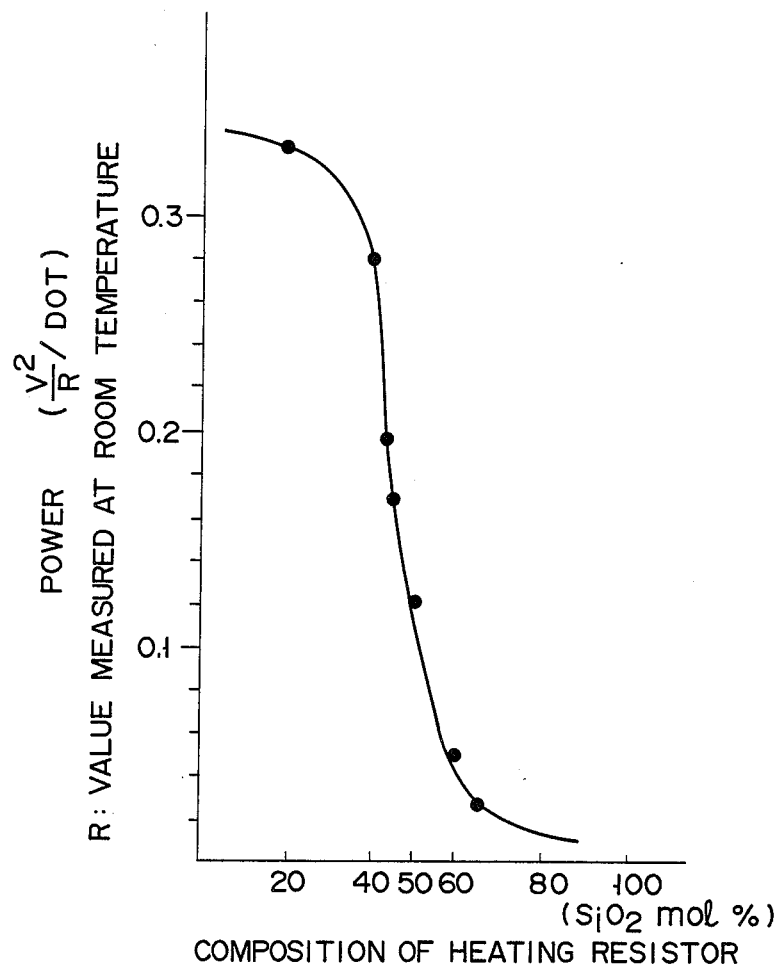
FIG. 3 is a graph showing test results which explain the power required to obtain a optical density of 1.0 when the silicon oxide, in terms of SiO$_2$ mol%, of a resistive layer is changed.

FIG. 2 demonstrates that recorded information with a high optical density can be obtained at low power when a thermal head has a highly resistant resistive layer. FIG. 2 and Table 2 show that higher optical density, i.e., good thermal efficiency, can be obtained at low power when the resistive layer is made of a material of high resistivity. When the mol% of SiO$_2$ contained in the resistive layer is increased, resistivity increased and thermal conductivity decreased. A more detailed description will be made with reference to FIG. 4. When resistivity of the Ta-Si-O resistive layer is increased while the materials and dimensions of the alumina substrate, the lead layers, and the protective layer remain the same, heat resistance is increased. When heat resistance is increased, heat flow q$_S$, toward the lead layers, decreases, and thus heat flow q$_P$ increases with reference to heat flow q$_P$. FIG. 3 shows the relationship between the mol% of SiO$_2$ contained in a resistive layer and the power (V$^2$/R)/dot applied to the resistive layer at a optical density of 1.0 in each characteristic curve of FIG. 2. It should be noted that characteristic values obtained during a test by the present inventors have been added to those of FIG. 2. The test conditions are in accordance with those of Table 3.

The power which the resistive layer requires to print data in a certain density is not inversely proportional to the resistivity of the material of the element. The resistivity of the material is proportional to the heat resistance thereof. FIG. 3 shows that the power required can be minimized when the SiO$_2$ content in the thin Ta-Si-O film is more than 45 mol%, and 75 mol% at most. The resistive layers made of Ta-Si-O compositions whose SiO$_2$ contents are 45 mol% or less require substantially the same high power. For example, in a Ta-SiO$_2$ film containing 20 mol% (resistivity is 2 mΩ-cm to 4 mΩ-cm) of SiO$_2$, power of 0.33 V$^2$/R/dot is required to obtain a optical density of 1.0. A Ta-SiO$_2$ film containing 0 mol% (resistivity is 0.2 mΩ-cm to 0.4 mΩ-cm) of SiO$_2$ requires power of 0.34 (V$^2$/R)/dot to obtain a optical density of 1.0. There is no great difference in power required by these films. When the content of SiO$_2$ is 45 mol% or less and the film's resistivity is decreased, higher power and hence a large power source is required. As a result, the thickness of the lead layer must be increased to withstand the current emitted from the large power source, and, similarly, the current capacity of the driving IC must also be increased. Invariably, the resultant thermal head, characterized by decreased resistivity, is large in size and costly.

Figure 4:
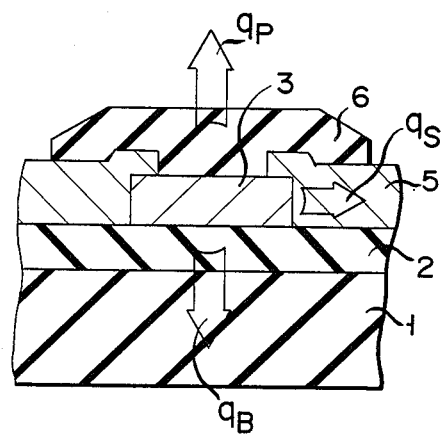
FIG. 4 is a sectional view explaining the direction of heat flow when the resistive layer begins, emitting heat.

On the other hand, when the SiO$_2$ content of the Ta-Si-O resistive layer is more than 75 mol% to increase resistivity, the required amount of power will not decrease. This is because heat flow $q_S$ hardly decreases, and heat flow $q_P$ scarcely increases, since the heat flow which depends on the shape of the resistive layer of FIG. 4 is limiting. It should be noted that in Ta-Si-O resistive layers, resistivity is proportional to heat resistance when the composition of the resistive layers is kept unchanged.

As is apparent from the above description, when the content of $SiO_2$ in the resistive layer is more than 45 mol%, and 75 mol% at most, the resistivity of the Ta-Si-O resistive layer is increased, and the heat resistance thereof is also increased. As a result, heat flow $q_S$ in FIG. 4 is decreased and heat flow $q_P$ is relatively increased, so that the proportion of heat flow conducted toward the heat-sensitive paper is increased, facilitating good, thermally efficient printing.

In order to micronize the lead layers, the driving IC and the like, and hence decrease the overall size of the thermal head, the power applied to each resistive layer in the thermal head should, preferably, be 0.1 $(V^2/R)$/dot or less. In order to satisfy this characteristic, the content of $SiO_2$ needs, preferably, to be more than 53 mol%, and 75 mol% at most.

What is claimed is:

1. A thermal head, comprising:
    a thin Ta-Si-O film as an electrically resistive layer, for generating heat to print on heat-sensitive paper, wherein said resistive layer contains more than 53 mol% and at most 75 mol% of silicon oxide in terms of $SiO_2$; and
    a protective layer covering said resistive layer.

2. A thermal head according to claim 1, wherein said resistive layer contains more than 59 mol% and at most 62 mol% of silicon oxide in terms of $SiO_2$.

3. A method of manufacturing a thermal head, comprising the steps of:
    mixing tantalum and $SiO_2$ and sintering a mixture thereof to prepare a sintered target, such that the silicon oxide content, in terms of $SiO_2$ contained in said sintered target, is more than 53 mol%, and 75 mol% at most;
    sputtering said sintered target in a vacuum atmosphere at an argon gas partial pressure of $10 \times 10^{-3}$ Torr to $80 \times 10^{-3}$ Torr to prepare an electrically resistive layer of a thin Ta-Si-O film; and
    depositing a protective layer on said resistive layer.

4. A method according to claim 3, wherein the argon gas partial pressure is $25 \times 10^{-3}$ Torr to $50 \times 10^{-3}$ Torr.

5. A thermal head comprising:
    a thin Ta-Si-O film as an electrically resistive layer, for generating heat to print on heat sensitive paper, wherein said resistive layer contains more than 53 mol% and at most 75 mol% of silicon oxide in terms of $SiO_2$ so that the power supplied to each resistive layer is $(0.1 (V^2/R))$/dot or less; and
    a protective layer covering said resistive layer.

6. A method according to claim 3, wherein said sintered target contains more than 59 mol% and at most 62 mol% of silicon oxide in terms of $SiO_2$.

* * * * *